(12) United States Patent
Joo et al.

(10) Patent No.: US 8,461,003 B2
(45) Date of Patent: Jun. 11, 2013

(54) METHOD FOR FABRICATING 3D-NONVOLATILE MEMORY DEVICE

(75) Inventors: Han-Soo Joo, Gyeonggi-do (KR); Sang-Hyun Oh, Gyeonggi-do (KR); Yu-Jin Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 40 days.

(21) Appl. No.: 13/112,767

(22) Filed: May 20, 2011

(65) Prior Publication Data
US 2012/0231593 A1    Sep. 13, 2012

(30) Foreign Application Priority Data
Mar. 7, 2011    (KR) .................. 10-2011-0019859

(51) Int. Cl.
*H01L 21/336* (2006.01)
(52) U.S. Cl.
USPC .................... 438/268; 438/212; 257/E21.212
(58) Field of Classification Search
USPC .......... 438/206, 209, 269, 532; 257/E21.532, 257/E21.533, E21.536, E21.613
See application file for complete search history.

(56) References Cited

U.S. PATENT DOCUMENTS

| | | | |
|---|---|---|---|
| 2010/0097859 A1* | 4/2010 | Shim et al. | 365/185.05 |
| 2011/0045657 A1* | 2/2011 | Kim et al. | 438/476 |

FOREIGN PATENT DOCUMENTS

| | | |
|---|---|---|
| JP | 2009-135328 | 6/2009 |
| JP | 2009-224612 | 10/2009 |
| KR | 109920836 | 10/2009 |
| KR | 1020100034612 | 4/2010 |

OTHER PUBLICATIONS

Office Action issued by the Korean Intellectual Property Office on Apr. 30, 2012.
Notice of Allowance issued by the Korean Intellectual Property Office on Nov. 9, 2012.

* cited by examiner

*Primary Examiner* — Cheung Lee
(74) *Attorney, Agent, or Firm* — IP & T Group LLP

(57) ABSTRACT

A method for fabricating a 3D-nonvolatile memory device includes forming a sub-channel over a substrate, forming a stacked layer over the substrate, the stacked layer including a plurality of interlayer dielectric layers that are alternatively stacked with conductive layers, selectively etching the stacked layer to form a first open region exposing the sub-channel, forming a main-channel conductive layer to gap-fill the first open region, selectively etching the stacked layer and the main-channel conductive layer to form a second open region defining a plurality of main channels, and forming an isolation layer to gap-fill the second open region.

8 Claims, 11 Drawing Sheets

US 8,461,003 B2

METHOD FOR FABRICATING 3D-NONVOLATILE MEMORY DEVICE

CROSS-REFERENCE TO RELATED APPLICATIONS

The present application claims priority of Korean Patent Application No. 10-2011-0019859, filed on Mar. 7, 2011, which is incorporated herein by reference in its entirety.

BACKGROUND

1. Field

Exemplary embodiments of the present invention relate to a method for fabricating a semiconductor device, and more particularly, to a method for fabricating a 3D-nonvolatile memory device.

2. Description of the Related Art

A nonvolatile memory device refers to a memory device which retains stored data, even though power supply is cut off. Currently, a variety of nonvolatile memory devices including a flash memory are being widely used.

As further developments in the miniaturization and high integration of semiconductor devices are sought, device scaling is reaching limits while more memory cells are to be formed within a limited area to increase the memory capacity thereof. For example, there are difficulties in realizing further increase in integration using lithography technology. Here, in the case of a nonvolatile flash memory device, 32 GB flash memories are fabricated by using a 40 nm lithography process, and 64 Gb flash memories are fabricated by using a 30 nm lithography process. In order to further increase the integration degree and the memory capacity, a method for fabricating 3D-nonvolatile memory device is being developed.

SUMMARY

An embodiment of the present invention is directed to a method for fabricating a 3D-nonvolatile memory device.

In accordance with an embodiment of the present invention, a method for fabricating a 3D-nonvolatile memory device includes: forming a sub-channel over a substrate; forming a stacked layer over the substrate, the stacked layer including a plurality of interlayer dielectric layers that are alternatively stacked with conductive layers; selectively etching the stacked layer to form a first open region exposing the sub-channel; forming a main-channel conductive layer to gap-fill the first open region; selectively etching the stacked layer and the main-channel conductive layer to form a second open region defining a plurality of main channels; and forming an isolation layer to gap-fill the second open region.

In accordance with another embodiment of the present invention, a method for fabricating a 3D-nonvolatile memory device includes: forming a sub-channel over a substrate; forming a stacked layer over the substrate, the stacked layer including a plurality of interlayer dielectric layers that are alternatively stacked with conductive layers; selectively etching the stacked layer to form a first open region exposing the sub-channel; performing a cleaning process to form raised portions and recessed portions on sidewalls of the first open region; forming a main-channel conductive layer to gap-fill the first open region; selectively etching the stacked layer and the main-channel conductive layer to form a second open region defining a plurality of main channels; and forming an isolation layer to gap-fill the second open region.

DETAILED DESCRIPTION

Figure 1A:
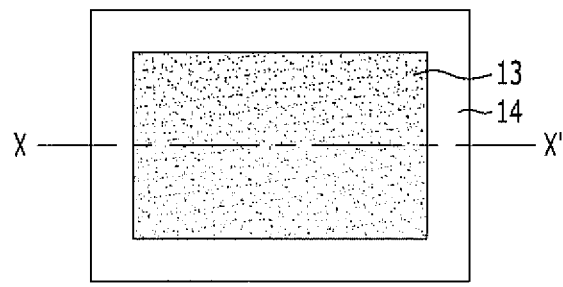
FIGS. 1A to 1G are plan views illustrating a method for fabricating a 3D-nonvolatile memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1G are plan views illustrating a method for fabricating a 3D-nonvolatile memory device in accordance with a first embodiment of the present invention. FIGS. 2A to 2G are cross-sectional views taken along lines X-X' of FIGS. 1A to 1G, respectively.

Figure 2A:
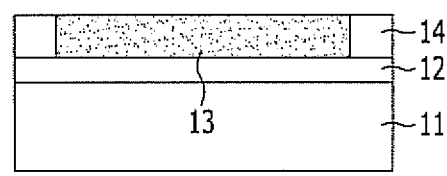
FIGS. 2A to 2G are cross-sectional views taken along lines X-X' of FIGS. 1A to 1G, respectively.

Referring to FIGS. 1A and 2A, a buried insulation layer 12 is formed on a substrate 11 (shown in FIG. 2A). The buried insulation layer 12 in FIG. 2A serves to electrically isolate the substrate 11 from a sub-channel 13 which is to be formed by a subsequent process. The buried insulation layer 12 may be formed of oxide.

An insulation layer 14 is formed on the buried insulation layer 12 to electrically isolate the sub-channel 13 from an adjacent sub-channel 13. The sub-channel 13 serves to electrically couple a plurality of main channels which are to be formed by a subsequent process. The sub-channel 13 may be formed of any one selected from the group consisting of a silicon layer, a metallic layer, and a nano tube. The metallic layer includes a metal layer, a metal oxide layer, a metal nitride layer, and a metal silicide layer.

Figure 1B:
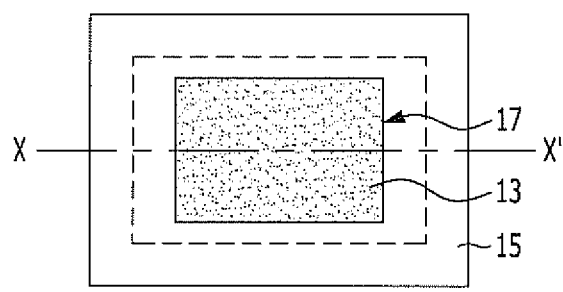
Figure 2B:
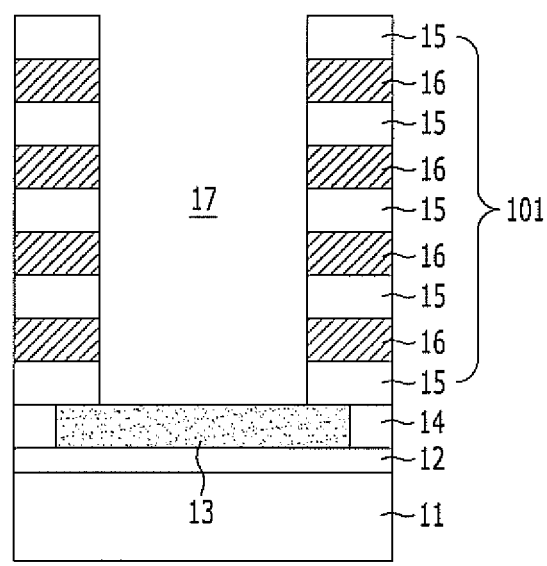

Referring to FIGS. 1B and 2B, a stacked layer 101 is formed on the substrate 11 having the sub-channel 13 formed thereon. The stacked layer 101 includes a plurality of interlayer dielectric layers 15 and conductive layers 16 which are alternately stacked. At this time, the numbers of the interlayer dielectric layers 15 and the conductive layers 16 to be stacked may be adjusted according to the number of memory cells (MC) to be implemented. The interlayer dielectric layers 15 each serve as an isolation layer for electrically isolating the sub-channel 13 from a conductive layer 16, an isolation layer for electrically isolating a conductive layer 16 from another conductive layer 16, or an isolation layer for electrically isolating a conductive layer 16 from a gate electrode of a selection transistor to be formed by a subsequent process. The conductive layers 16 serve as word lines or control gates.

The stacked layer 101 is selectively etched to form a first open region 17 exposing the sub-channel 13. The first open region 17 may be formed by using a dry etching method. The first open region 17 may be formed as a hole type.

Figure 1C:
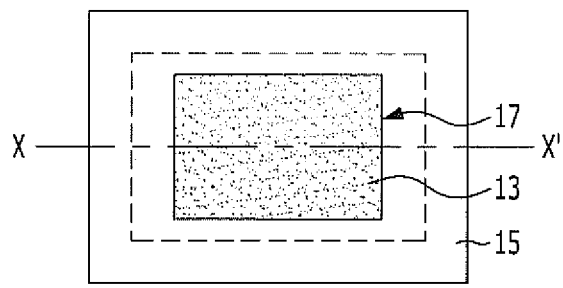
Figure 2C:
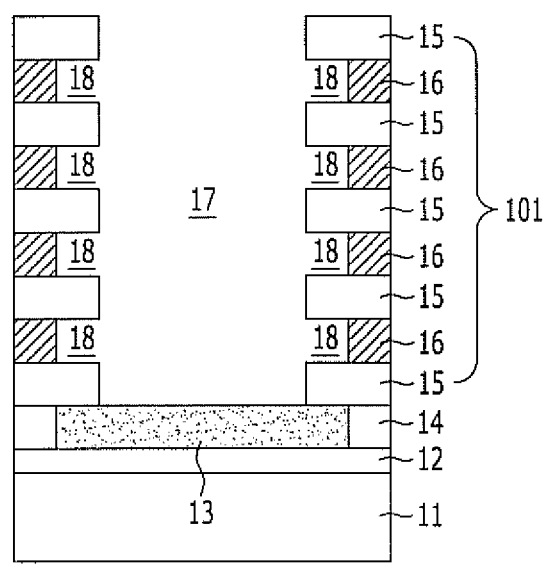

Referring to FIGS. 1C and 2C, a cleaning process is performed in such a manner that the sidewalls of the first open region 17 have raised portions and recessed portions. Specifically, the cleaning process may be performed by using a cleaning agent having a higher etch rate for the conductive layer 16 than the interlayer dielectric layer 15. Then, the internal sidewalls of the conductive layer 16 are further recessed toward the outside sidewalls than the sidewalls of the interlayer dielectric layer 15.

Meanwhile, in order to substantially prevent the sub-channel 13 exposed through the first open region 17 from being damaged during the cleaning process, a protective layer which is not illustrated in the drawings may be formed to gap-fill the first open region 17, before the cleaning process is performed. The protective layer is removed during the cleaning process.

Figure 1D:
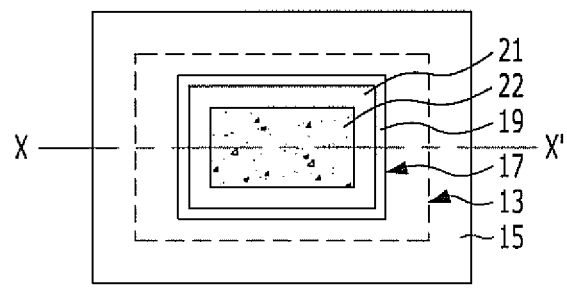
Figure 2D:
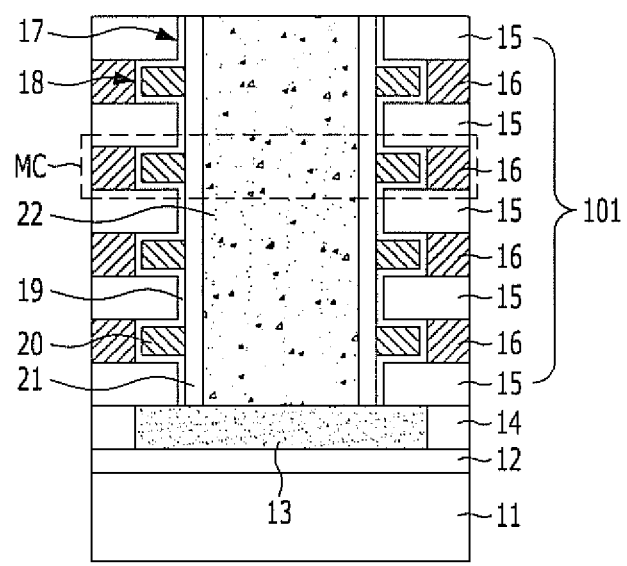

Referring to FIGS. 1D and 2D, a dielectric layer 19 is formed along the sidewall profile of the first open region 17. At this time, after the dielectric layer 19 is formed along the surface of the structure including the first open region 17, a blanket process, for example, an etchback process is performed in such a manner that the dielectric layer 19 remains only on the sidewalk of the first open region 17.

Floating gates 20 are formed on the dielectric layer 19 so as to gap-fill grooves 18. The floating gates 20 are formed by the following series of process: a floating gate conductive layer is formed in the first open region 17 so as to fill the grooves 18 and an etching process is performed in such a manner that the floating gate conductive layer remains only in the grooves 18.

A tunnel insulation layer 21 is formed on the sidewalls of the first open region 17. After the tunnel insulation layer 21 is formed along the surface of the structure in which the dielectric layer 19 and the floating gates 20 are formed, a blank process is performed in such a manner that the tunnel insulation layer 21 remains only on the sidewalk of the first open region 17.

A main-channel conductive layer 22 is formed to gap-fill the first open region 17. The main-channel conductive layer 22 may be formed of a silicon layer, and an impurity-doped silicon layer may be used as the silicon layer.

Through the above-described process, a plurality of memory cells MC in which a main-channel conductive layer 22, a tunnel insulation layer 21, a floating gate 20, and a dielectric layer 19, and a conductive layer 16 serving as a word line or control gate are staked in the horizontal direction may be formed, and simultaneously, a string in which the plurality of memory cells MC are stacked in the vertical direction may be formed.

Figure 1E:
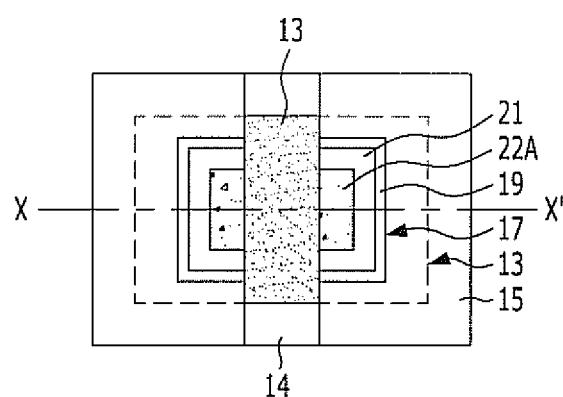
Figure 2E:
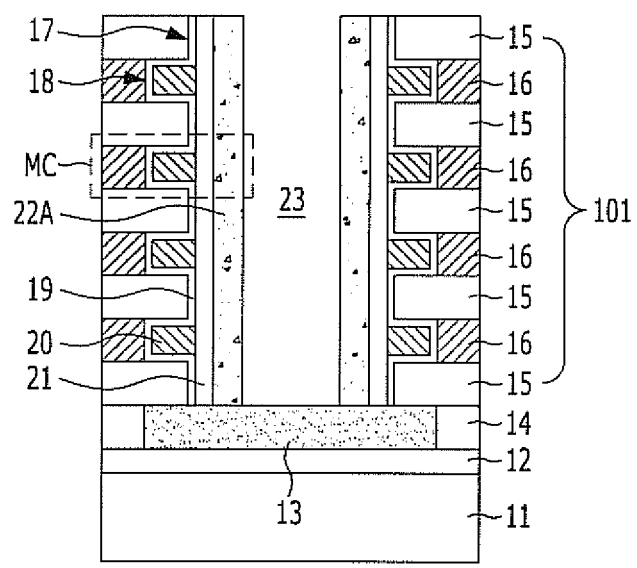

Referring to FIGS. 1E and 2E, the main-channel conductive layer 22, the tunnel insulation layer 21, the floating gates 20, the conductive layer 19, and the stacked layer 101 are selectively etched until the sub-channel 13 is exposed, thereby forming a second open region 23 which separates the main-channel layer 22 into two main channels 22A. The second open region 23 may be formed as a line type by using a dry etching method.

As the second open region 23 is formed through the above-described process, the two main channels 22A formed by separating the main-channel conductive layer 22 are coupled to the sub-channel 13 such that the entire channel has a 'U' shape. As one memory cell MC is separated into two memory cells MC, the number of memory cells composing a string within the same area is doubled.

Figure 1F:
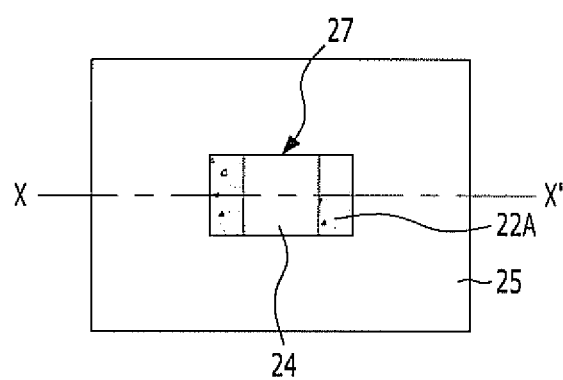
Figure 2F:
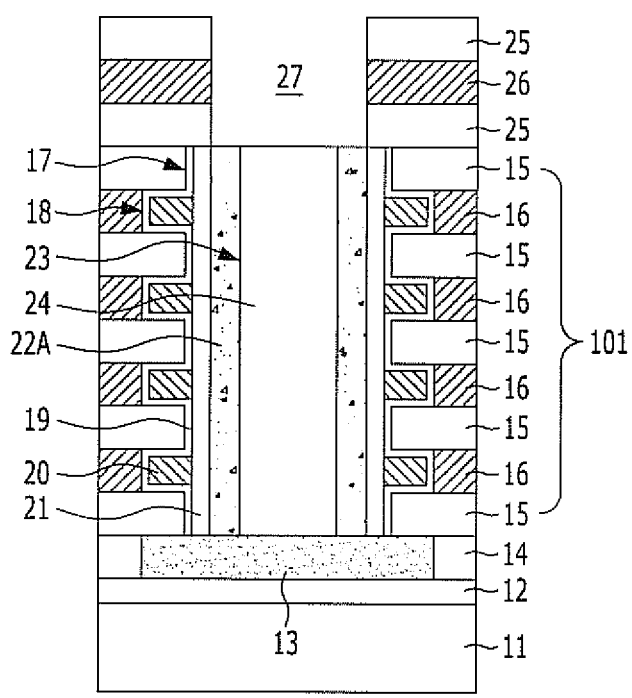

Referring to FIGS. 1F and 2F, an isolation layer 24 is formed by burying an insulation material in the second open region 23. The isolation layer 23 serves to electrically isolate adjacent main channels 22A, that is, memory cells MC adjacent in the horizontal direction.

A plurality of interlayer dielectric layers 25 and a gate conductive layer 26 inserted between the respective interlayer dielectric layers 25 are formed over the resultant structure including the isolation layer 24, and then etched to form a third open region 27 exposing the two main channels 22A.

Figure 1G:
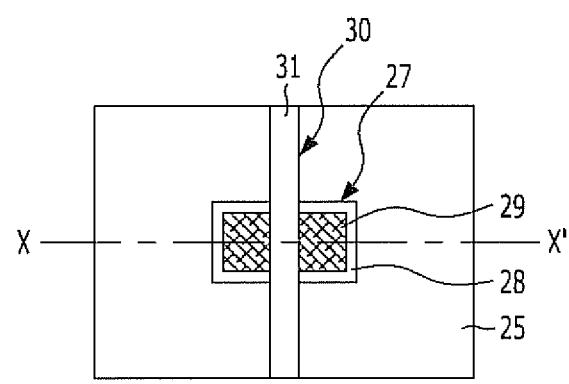
Figure 2G:
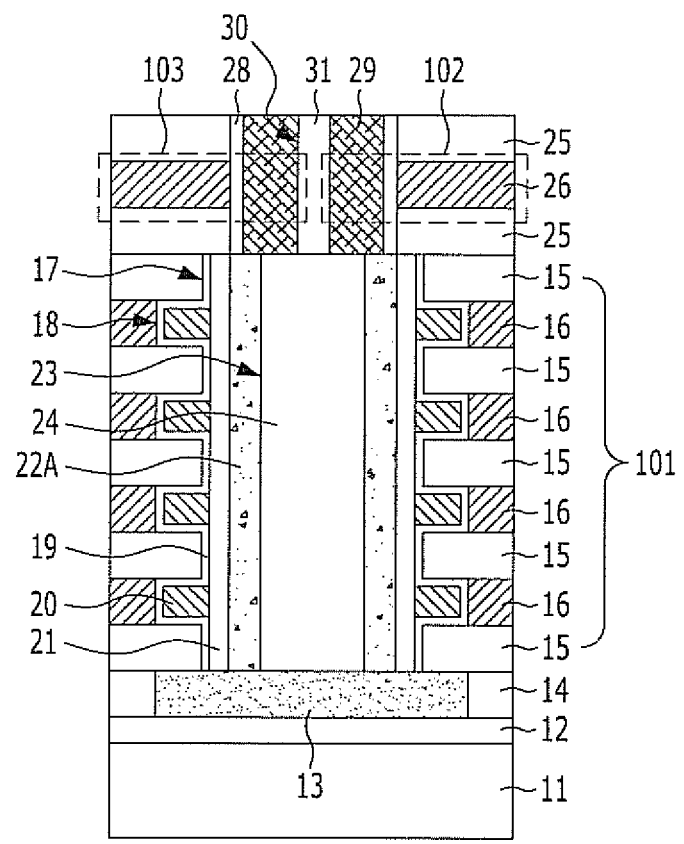

Referring to FIGS. 1G and 2G, a gate dielectric layer 28 is formed on the sidewalls of the third open region 27, and a channel layer 29 is formed to gap-fill the third open region 27.

The channel layer 29, the gate dielectric layer 28, the interlayer dielectric layers 25, and the gate conductive layer 26 are selectively etched to form a fourth open region 30 which separates the channel layer 29 into two parts. The fourth open region 30 may be formed as a line type extending in the same direction as the second open region 23.

An isolation insulation layer 31 is formed to gap-fill the fourth open region 30. The isolation insulation layer 31 serves to electrically isolate the adjacent channel layers 29.

Through the above-described process, a first selection transistor 102 and a second selection transistor 103 may be formed over the resultant structure including the isolation layer 24. The first selection transistor 102 includes a channel layer 29 coupled to a main channel 22A positioned in one side of the isolation layer 24, and the second selection transistor 103 includes a channel layer 29 coupled to a main channel 22A positioned in the other side of the isolation layer 24.

In accordance with the first embodiment of the present invention, a 3D-nonvolatile memory device having a U-shaped channel may be fabricated. More specifically, by forming the U-shaped channel including the main channels 22A protruded from the substrate 11 and the sub-channel 13 coupling the adjacent main channels 22A, the number of memory cells MC included in one string within the same area may be increased to be twice or greater.

Furthermore, since the selection transistors are formed over the memory cells MC after the plurality of memory cells MC are formed, the selection transistor formation process may be simplified.

FIGS. 3A to 3d are plan views illustrating a method for fabricating a 3D-nonvolatile memory device in accordance with a second embodiment of the present invention. FIGS. 4A to 4D are cross-sectional views taken along X-X' lines of FIGS. 3A to 3D, respectively.

Figure 3A:
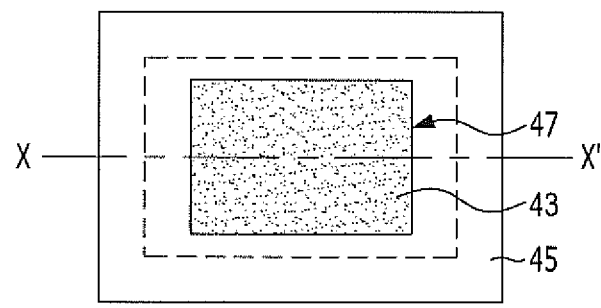
FIGS. 3A to 3d are plan views illustrating a method for fabricating a 3D-nonvolatile memory device in accordance with a second embodiment of the present invention.
Figure 4A:
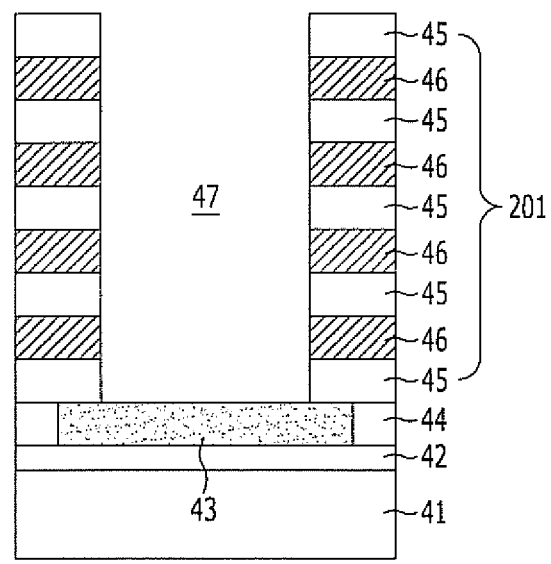
FIGS. 4A to 4D are cross-sectional views taken along X-X' lines of FIGS. 3A to 3D, respectively.

Referring to FIGS. 3A and 4A, an insulation layer 44 is formed on a substrate 41 having a buried insulation layer 42 formed thereon. The insulation layer 44 serves to electrically isolate a sub-channel 43 from an adjacent sub-channel 43.

A stacked layer 201 is formed on the substrate 41 having the sub-channel 43 formed thereon. The stacked layer 210 includes a plurality of interlayer dielectric layers 45 and conductive layers 46 which are alternately stacked. The numbers of the interlayer dielectric layers 45 and the conductive layers 46 to be stacked may be adjusted according to the number of memory cells (MC) to be implemented.

The stacked layer 201 is selectively etched to form a first open region 47 exposing the sub-channel 43. The first open region 47 may be formed in a hole type.

Figure 3B:
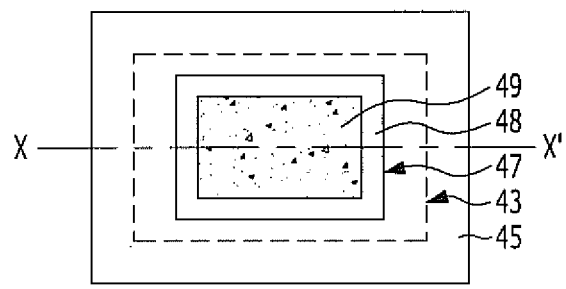
Figure 4B:
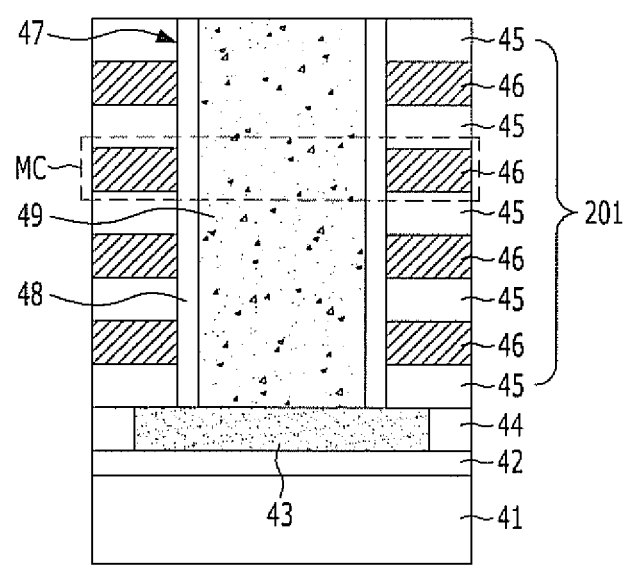

Referring to FIGS. 3B and 4B, a memory layer 48 is formed on the sidewalls of the first open region 47. The memory layer 48 is formed as a stacked layer of a charge blocking layer, a charge trapping layer, and a tunnel insulation layer which are sequentially stacked. Here, the charge blocking layer serves to prevent charges from passing through the charge trapping layer and moving to the conductive layer 45. The charge trapping layer serves to store data by trapping charges. The tunnel insulation layer serves as an energy storage wall according to charge tunneling.

After the memory layer 48 is formed along the surface of the structure including the first open region 47, a blanket process, for example, an etch back process is performed in such a manner that the memory layer 48 remains only on the sidewalls of the first open region 47.

A main-channel conductive layer 49 is formed to gap-fill the first open region 47. The main-channel conductive layer 49 may be formed of a silicon layer, and an impurity-doped silicon layer may be used as the silicon layer.

Through the above-described process, a plurality of memory cells MC in which the main-channel conductive layer 49, the memory layer 48, and the conductive layer 46 serving as a word line are stacked in the horizontal direction may be formed, and simultaneously, a string in which a plurality of memory cells MC are stacked in the vertical direction may be formed.

Figure 3C:
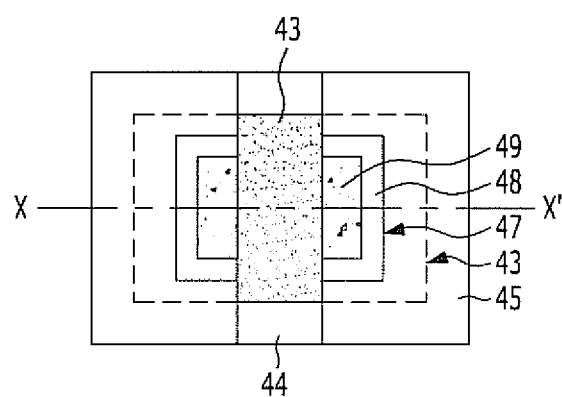
Figure 4C:
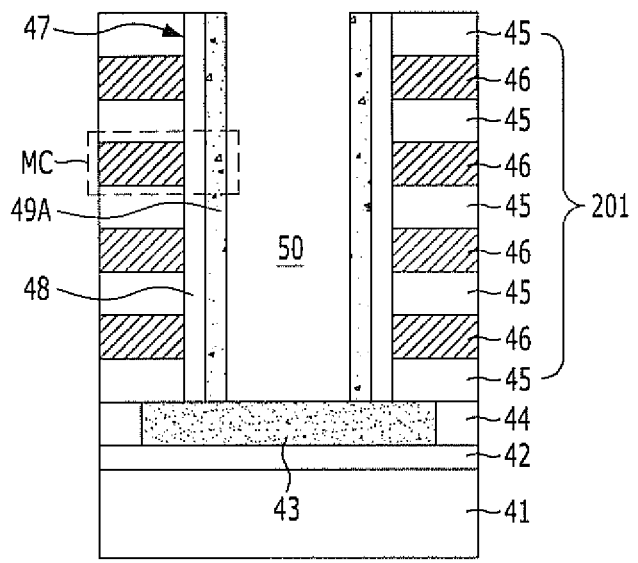

Referring to FIGS. 3C and 4C, the main-channel conductive layer 49, the memory layer 48, and the stacked layer 201 are selectively etched until the sub-channel 43 is exposed, thereby forming a second open region 50 which separates one memory cell MC into two parts, that is, separates the memory-channel conductive layer 49 into two main channels 49A. The second open region 50 may be formed as a line type.

As the second open region 50 is formed through the above-described process, the two main channels 49A formed by separating the main-channel conductive layer 49 are coupled to the sub-channel 43 such that the entire channel has a 'U' shape. As one memory cell MC is separated into two memory cells, the number of memory cells MC composing a string within the same area is doubled.

Figure 3D:
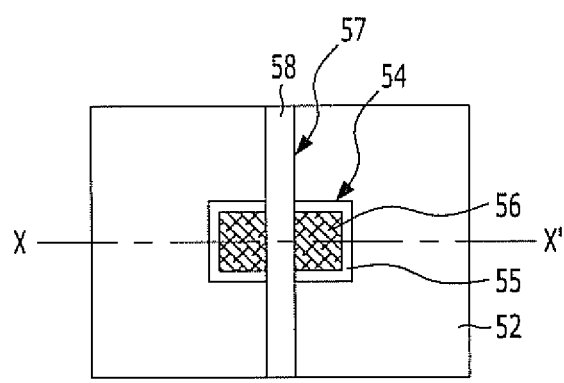
Figure 4D:
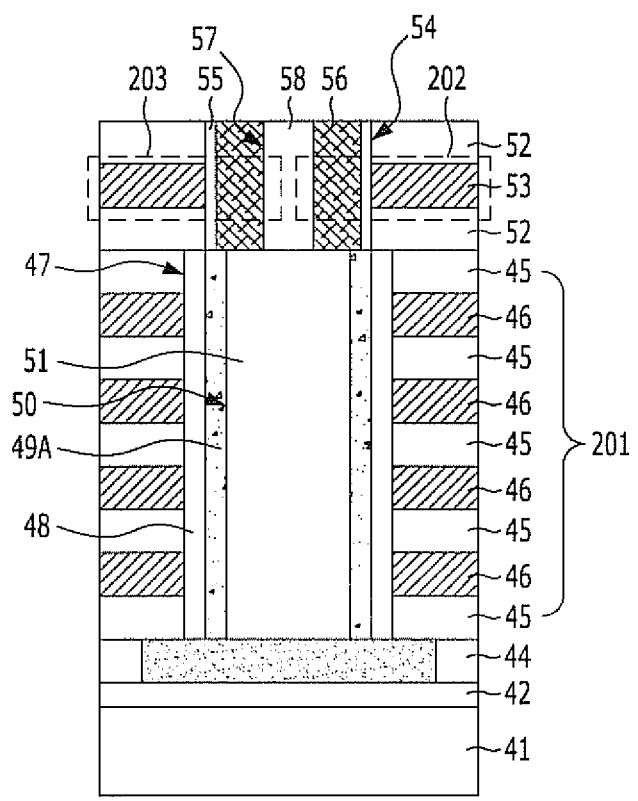

Referring to FIGS. 3D and 4D, an isolation layer 51 is formed by burying an insulation material in the second open region 50. The isolation layer 51 serves to electrically isolate adjacent main channels 49A, that is, memory cells MC adjacent in the horizontal direction.

A plurality of interlayer dielectric layers 52 and a gate conductive layer 53 inserted between the respective interlayer dielectric layers 52 are formed over the structure including the isolation layer 51, and then etched to form a third open region 54 exposing the two main channels 49A.

A gate dielectric layer 55 is formed on the sidewalls of the third open region 54, and a conductive layer 56 is formed to gap-fill the third open region 54.

The channel layer 56, the gate dielectric layer 55, the interlayer dielectric layers 52, and the gate conductive layer 53 are selectively etched to form a fourth open region 57 which separates the channel layer 56 into two parts. The fourth open region 57 may be formed as a line type extending in the same direction as the second open region 50.

An isolation insulation layer 58 is formed to gap-fill the fourth open region 57. The isolation insulation layer 58 serves to electrically isolate adjacent channel layers 56 from each other.

Through the above-described process, a first selection transistor 202 and a second selection transistor 203 may be formed over the resultant structure including the isolation layer 51. The first isolation transistor 202 includes a channel layer 56 coupled to a main channel 49A positioned on one side of the isolation layer 51, and the second isolation transistor 203 includes a channel layer 56 coupled to a main channel 49A positioned on the other side of the isolation layer 51.

In accordance with the second embodiment of the present invention, a 3D-nonvolatile memory device having a U-shaped channel may be fabricated. More specifically, by forming the U-shaped channel including the main channels 49A protruded from the substrate 41 and the sub-channel 43 coupling the adjacent main channels 49A, the number of memory cells MC included in one string within the same area may be increased to be twice or more.

Furthermore, since the selection transistors are formed over the plurality of memory cells MC after the memory cells MC are formed, the selection transistor formation process may be simplified.

In accordance with the embodiments of the present invention, by forming the plurality of main channels and the sub-channel coupling the main channels, a 3D-nonvolatie memory device having a U-shaped channel may be fabricated. Accordingly, the number of memory cells included in one string may be doubled or more within the same area.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a three dimensional (3D) nonvolatile memory device, comprising:
   forming a buried insulation layer over a substrate;
   forming a sub-channel on the buried insulation layer;
   forming an insulation layer on the buried insulation layer to electrically isolate the sub-channel from an adjacent sub-channel:
   forming a stacked layer over the substrate, the stacked layer including a plurality of interlayer dielectric layers that are alternatively stacked with conductive layers;
   selectively etching the stacked layer to form a first open region exposing the sub-channel;
   forming a main-channel conductive layer to gap-fill the first open region;
   selectively etching the stacked layer and the main-channel conductive layer to form a second open region defining a plurality of main channels; and
   forming an isolation layer to gap-fill the second open region,
   wherein the sub-channel and the plurality of main channels form a U-shaped channel.

2. The method of claim 1, further comprising forming a memory layer on sidewalls of the first open region before the forming of the main-channel conductive layer.

3. The method of claim 2, wherein the memory layer comprises a charge blocking layer, a charge trapping layer, and a tunnel insulation layer which are sequentially stacked.

4. The method of claim 1, wherein the first open region is formed as a hole type and the second open region is formed as a line type to separate portions of the first open region.

5. The method of claim 1, further comprising forming selection transistors over the resultant structure including the isolation layer, wherein the selection transistors are coupled to the respective main channels.

6. The method of claim 5, wherein the forming of the selection transistors comprises:
   sequentially forming an interlayer dielectric layer, a gate conductive layer, and an interlayer dielectric layer over the resultant structure including the isolation layer;

selectively etching the interlayer dielectric layers and the gate conductive layer and forming a third open region which exposes the plurality of main channels;

forming a gate dielectric layer on sidewalls of the third open region;

forming a channel conductive layer to gap-fill the third open region;

selectively etching the interlayer dielectric layers, the gate conductive layer, the gate dielectric layer, and the channel conductive layer and forming a fourth open region which defines a channel layer coupled to the respective main channels; and forming an isolation insulation layer to gap-fill the fourth open region.

7. The method of claim 6, wherein the third open region is formed as a hole type and the fourth open region is formed as a line type separating portions of the third open region.

8. The method of claim 6, wherein the fourth open region is formed as a line type extending in the same direction as the second open region.

* * * * *

UNITED STATES PATENT AND TRADEMARK OFFICE
CERTIFICATE OF CORRECTION

PATENT NO. : 8,461,003 B2  
APPLICATION NO. : 13/112767  
DATED : June 11, 2013  
INVENTOR(S) : Han-Soo Joo et al.

Page 1 of 1

It is certified that error appears in the above-identified patent and that said Letters Patent is hereby corrected as shown below:

On the title page, item [56]

Change the FOREIGN PATENT DOCUMENTS section as follows:

KR    100920836    10/2009

Signed and Sealed this  
Sixteenth Day of July, 2013

Teresa Stanek Rea  
*Acting Director of the United States Patent and Trademark Office*